(12) United States Patent
Park (10) Patent No.: US 8,593,868 B2
(45) Date of Patent: Nov. 26, 2013

(54) SEMICONDUCTOR MEMORY DEVICE

(75) Inventor: Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 31 days.

(21) Appl. No.: 13/453,440

(22) Filed: Apr. 23, 2012

(65) Prior Publication Data

US 2012/0268996 A1 Oct. 25, 2012

(30) Foreign Application Priority Data

Apr. 21, 2011 (KR) .................. 10-2011-0037168

(51) Int. Cl.
*G11C 16/04* (2006.01)
*G11C 16/06* (2006.01)

(52) U.S. Cl.
USPC ............ 365/185.12; 365/185.11; 365/185.18; 365/185.25

(58) Field of Classification Search
USPC ..................................... 365/185.12
See application file for complete search history.

(56) References Cited

U.S. PATENT DOCUMENTS 6,813,187 B2 * 11/2004 Lee .......................... 365/185.18
7,102,928 B2 * 9/2006 Kawamura .............. 365/185.17
7,173,861 B2 * 2/2007 Cho et al. ................ 365/185.29
7,480,187 B2 * 1/2009 Hwang ................... 365/185.33
7,663,922 B2 * 2/2010 Park et al. ............... 365/185.17

FOREIGN PATENT DOCUMENTS

| KR | 1020030014251 | 2/2003 |
| KR | 100801917 | 2/2008 |
| KR | 1020110001916 | 1/2011 |

OTHER PUBLICATIONS

Office Action issued by the Korean Intellectual Property Office on Sep. 26, 2012.

* cited by examiner

*Primary Examiner* — Son Mai
(74) *Attorney, Agent, or Firm* — IP & T Group LLP (57) ABSTRACT

A semiconductor memory device includes a memory cell array including memory block groups each coupled to bit lines, a page buffer group coupled to first bit lines of a first memory block group and configured to control voltages of the first bit lines of the first memory block group depending on data to be stored in memory cells in a program operation and configured to sense the voltage of the first bit lines in a read operation, at least one bit line coupling circuit configured to couple first bit lines of a $n^{th}$ memory block group to the page buffer group by selectively coupling first bit lines of the first to $n^{th}$ memory block groups in response to bit line coupling signals, and bit line control circuits configured to control second bit lines of the memory block groups in response to bit line control signals.

30 Claims, 8 Drawing Sheets

SEMICONDUCTOR MEMORY DEVICE

CROSS-REFERENCE TO RELATED APPLICATION

Priority to Korean patent application number 10-2011-0037168 filed on Apr. 21, 2011, the entire disclosure of which is incorporated by reference herein, is claimed.

BACKGROUND

Exemplary embodiments relate to a semiconductor memory device and, more particularly, to a semiconductor memory device including memory blocks coupled to bit lines.

A semiconductor memory device includes memory cells coupled to bit lines and configured to store data. The memory cells are classified into memory blocks. A sense circuit (or a page buffer) stores data in the memory cells by controlling the voltages of the bit lines on the basis of external data when a program operation is performed and reads data stored in the memory cells by sensing the voltages of the bit lines when a read operation is performed.

Meanwhile, in order to increase the data storage capacity, the number of memory cells increases as well. The length of the bit lines may increase, while an interval between the bit lines narrows. For this reason, parasitic capacitance between adjacent bit lines is increased in proportion to the length of the bit line and an interference phenomenon occurs between the adjacent bit lines, resulting in a low operating speed.

For example, in a program operation, unselected bit lines of even bit lines and odd bit lines are precharged, and voltage supplied to selected bit lines is determined depending on data to be stored in memory cells. Furthermore, in a read operation, after selected bit lines are precharged and unselected bit lines are discharged, data stored in memory cells is read by sensing a change in the voltages of the selected bit lines.

As the length of the bit lines increases, the precharging speed of the bit lines becomes slow. Accordingly, it takes more time to fully precharge the bit lines, and the operating speed becomes slow.

BRIEF SUMMARY

Exemplary embodiments relate to a semiconductor memory device capable of increasing the operating speed by reducing parasitic capacitance between bit lines.

A semiconductor memory device according to an aspect of the present disclosure includes a memory cell array including two or more memory block groups each coupled to bit lines; a page buffer group coupled to first bit lines of a first memory block group and configured to control voltages of the first bit lines of the first memory block group depending on data to be stored in memory cells in a program operation and configured to sense the voltage of the first bit lines in a read operation; at least one bit line coupling circuit configured to couple first bit lines of a $n^{th}$ memory block group, selected from among the memory block groups, to the page buffer group by selectively coupling first bit lines of the first to $n^{th}$ memory block groups in response to bit line coupling signals; and bit line control circuits configured to control second bit lines of the memory block groups in response to bit line control signals.

A semiconductor memory device according to another aspect of the present disclosure includes two or more memory block groups each including memory strings coupled between a common source line and respective bit lines; a page buffer group configured to control voltages of first bit lines of a memory block group, selected from among the memory block groups, depending on data to be stored in memory cells coupled to the first bit lines in a program operation and configured to sense the voltage of the first bit lines in a read operation; at least one bit line coupling circuit configured to couple the first bit lines of the selected memory block group to the page buffer group in response to bit line coupling signals; and two or more bit line control circuits configured to couple second bit lines of the selected memory block group to the common source line thereof and control voltage of second bit lines of memory blocks remaining among the memory block groups depending on the program operation and the read operation in response to the bit line control signals.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
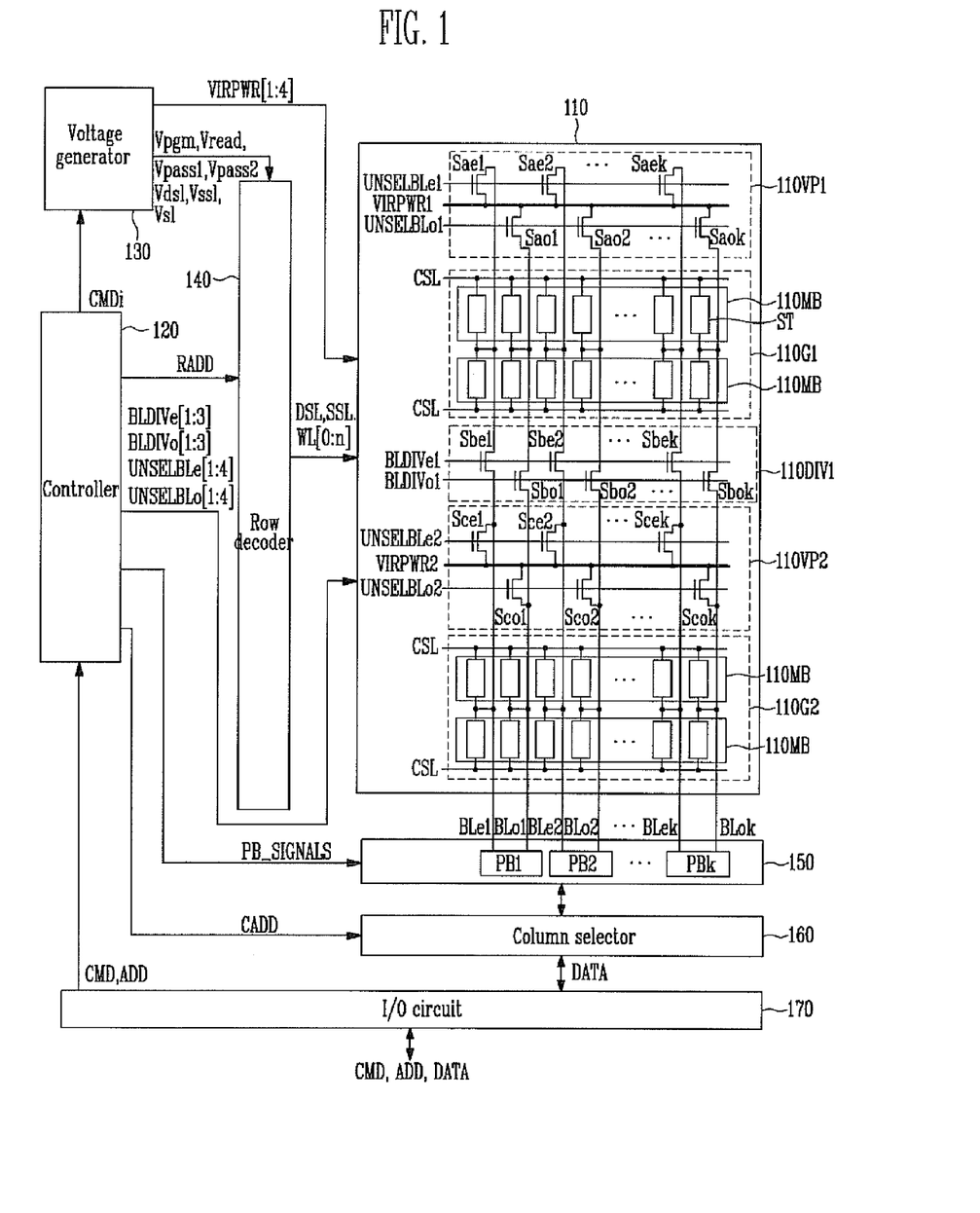
FIG. 1 is a block diagram of a semiconductor memory device according to an exemplary embodiment of this disclosure.
Figure 2:
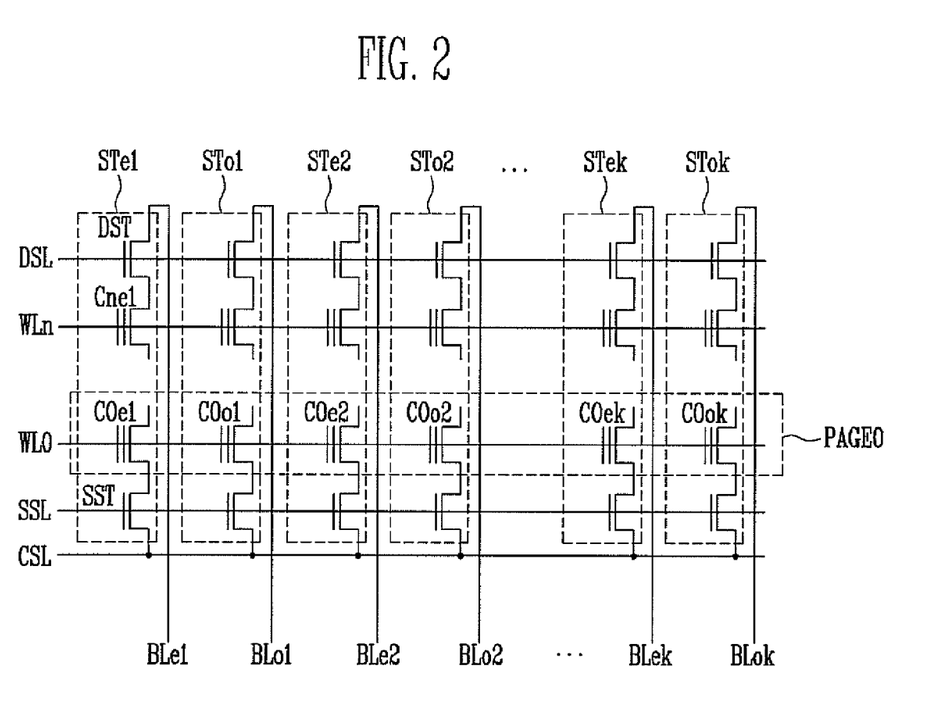
FIG. 2 is a circuit diagram of a memory block shown in FIG. 1.
Figure 3:
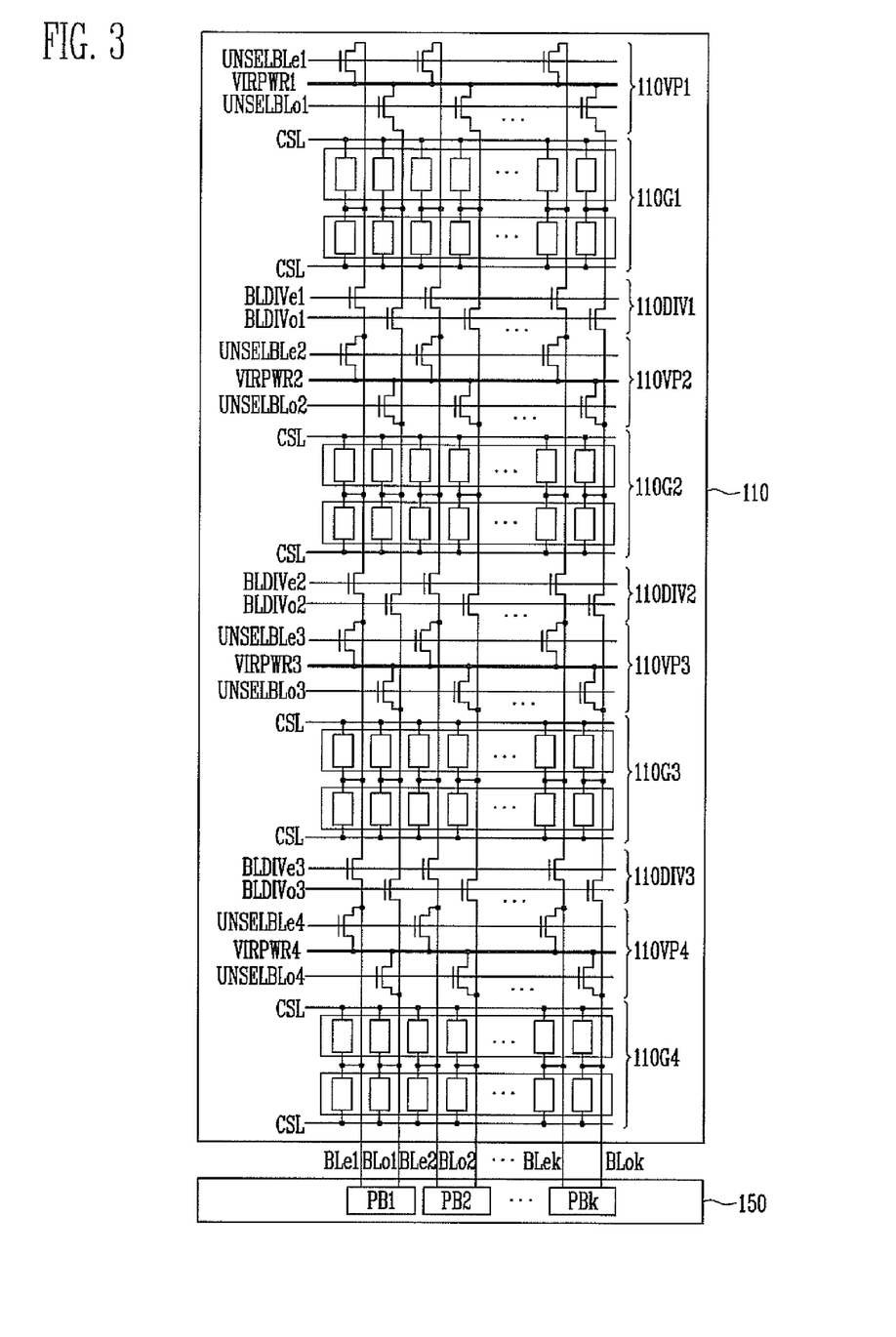
FIG. 3 is a block diagram of a semiconductor memory device according to another exemplary embodiment of this disclosure.

FIG. 1 is a block diagram of a semiconductor memory device according to an exemplary embodiment of this disclosure, FIG. 2 is a circuit diagram of the memory block shown in FIG. 1, and FIG. 3 is a block diagram of a semiconductor memory device according to another exemplary embodiment of this disclosure.

Referring to FIG. 1, the semiconductor memory device includes a memory cell array 110, a page buffer group 150, a bit line coupling circuit 110DIV1, and bit line control circuits 110VP1 and 110VP2. The semiconductor memory device further includes a voltage supply circuit (130 and 140) for supplying operating voltages to memory blocks 110MB. The semiconductor memory device may further include a column selector 160 for controlling the transfer of data between the page buffer group 150 and an I/O circuit 170. In a program operation or a read operation, the circuits 110DIV1, 110VP1, 110VP2, 130, 140, 150, and 160 are controlled by a controller 120. The above elements are described in detail below.

The memory cell array 110 includes a plurality of memory block groups (e.g., first and second memory block groups 110G1 and 110G2). Each (e.g., 110G1) of the memory block groups includes a plurality of the memory blocks 110MB.

Referring to FIG. 2, each of the memory blocks 110MB includes a plurality of strings STe1 to STek and STo1 to STok coupled between bit lines BLe1 to BLek and BLo1 to BLok and a common source line CSL. That is, the strings STe1 to STek and STo1 to STok are coupled to the respective bit lines BLe1 to BLek and BLo1 to BLok and are in common coupled to the common source line CSL. Each (e.g., STe1) of the strings includes a source select transistor SST having a source coupled to the common source line CSL, a plurality of memory cells C0e1 to Cne1, and a drain select transistor DST having a drain coupled to the bit line BLe1. The memory cells C0e1 to Cne1 are coupled in series between the select transistors SST and DST. The gate of the source select transistor SST is coupled to a source select line SSL, the gates of the memory cells C0e1 to Cne1 are coupled to respective word lines WL0 to WLn, and the gate of the drain select transistor DST is coupled to a drain select line DSL.

In case of a NAND flash memory device, the memory cells of a memory block may be classified by the physical page or the logical page. For example, the memory cells C0e1 to C0ek and C0o1 to C0ok coupled to a word line (e.g., WL0) may form a physical page PAGE0. Furthermore, the even-numbered memory cells C0e1 to C0ek coupled to the word line WL0 may form an even physical page, and the odd-numbered memory cells C0o1 to C0ok coupled thereto may form an odd physical page. The page (or the even or odd page) is a basic unit for a program operation or a read operation.

Referring to FIGS. 1 and 2, each of the first and the second memory block groups 110G1 and 110G2 includes two or more memory blocks 110MB. The memory blocks 110MB included in the first memory block group 110G1 share the bit lines BLe1 to BLek and BLo1 to BLok. Furthermore, the bit lines BLe1 to BLek and BLo1 to BLok of the first memory block group 110G1 are separated from those of the second memory block group 110G2. Accordingly, the first and the second memory block groups 110G1 and 110G2 are coupled to different bit lines.

The controller 120 generates a command signal CMDi for performing a program operation or a read operation in response to an external command signal CMD received via the I/O circuit 170 and generates PB control signals PB_SIGNALS for controlling the page buffers PB1 to PBk of the page buffer group 150 depending on a type of an operation. An operation of the controller 120 controlling the page buffer group 150 is described later. Furthermore, the controller 120 generates a row address signal RADD and a column address signal CADD in response to an external address signal ADD received via the I/O circuit 170. Particularly, the controller 120 generates bit line coupling signals BLDIVe1 and BLDIVo1 for controlling the bit line coupling circuit 110DIV1 and bit line control signals UNSELBLe1 and UNSELBLo1, and UNSELBLe2 and UNSELBLo2 for controlling the bit line control circuits 110VP1 and 110VP2 in response to the address signal ADD.

The voltage supply circuit (130 and 140) supplies operating voltages (e.g., Vpgm, Vread, Vpass1, Vpass2, Vdsl and Vssl, and Vsl) for the program operation and the read operation of memory cells to the local lines (e.g., the drain select line DSL, the word lines WL0 to WLn, and the source select line SSL) of a selected memory block in response to the command signal CMDi. The voltage supply circuit includes a voltage generator 130 and a row decoder 140.

The voltage generator 130 supplies global lines with the operating voltages (e.g., Vpgm, Vread, Vpass1, Vpass2, Vdsl, and Vssl) for the program operation or the read operation of memory cells in response to the command signal CMDi. For example, in the program operation, the voltage generator 130 may supply the global lines with the program voltage Vpgm to be supplied to memory cells belonging to a selected page and the program pass voltage Vpass1 to be supplied to unselected memory cells. In the read operation, the voltage generator 130 may supply the global lines with the read voltage Vread to be supplied to memory cells belonging to a selected page and the read pass voltage Vpass2 to be supplied to unselected memory cells. The select voltages Vdsl and Vssl are outputted for the respective select lines DSL and SSL.

The row decoder 140 couples the global lines and the local lines DSL, WL0 to WLn, and SSL of the memory block 110MB selected in the memory cell array 110 in response to the row address signals RADD so that the operating voltages outputted from the voltage generator 130 to the global lines may be transferred to the local lines DSL, WL0 to WLn, and SSL. Accordingly, the program voltage Vpgm or the read voltage Vread may be supplied from the voltage generator 130 to a local word line (e.g., WL0), coupled to a selected memory cell (e.g., C0e1), via a global word line. Furthermore, the program pass voltage Vpass1 or the read pass voltage Vpass2 may be supplied from the voltage generator 130 to local word lines (e.g., WL1 to WLn), coupled to unselected memory cells (e.g., C1e1 to Cne1), via global word lines. Accordingly, data is stored in the selected memory cell C0e1 by the program voltage Vpgm, or data stored in the selected memory cell C0e1 is read by the read voltage Vread.

The page buffer group 150 includes the plurality of page buffers PB1 to PBk coupled to the bit lines BLe1 to BLek and BLo1 to BLok of one (e.g., 110G2) of the first and the second memory block groups 110G1 and 110G2. Each of the page buffers PB1 to PBk of the page buffer group 150 may be coupled to a pair of the even bit line and the odd bit line. The page buffers PB1 to PBk selectively precharge the bit lines BLe1 to BLek or BLo1 to BLok depending on received data in order to store data in the memory cells C0e1 to C0ek or C0o1 to C0ok or sense the voltages of the bit lines BLe1 to BLek or BLo1 to BLok in order to read data from the memory cells C0e1 to C0ek or C0o1 to C0ok, in response to the PB control signals PB_SIGNALS.

For example, when program data (e.g., data '0') is inputted to the page buffer PB1 in order to store the program data in the memory cell C0e1, in a program operation, the page buffer PB1 supplies a program permission voltage (e.g., a ground voltage) to the bit line BLe1 coupled to the memory cell C0e1. Consequently, the threshold voltage of the memory cell C0e1 rises owing to the program voltage Vpgm supplied to the word line WL0 and the program permission voltage supplied to the bit line BLe1. Furthermore, when erase data (e.g., data '1') is inputted to the page buffer PB1 in order to store the erase data in the memory cell C0e1, in a program operation, the page buffer PB1 supplies a program inhibition voltage (e.g., a power supply voltage) to the bit line BLe1 coupled to the memory cell C0e1. Consequently, although the program voltage Vpgm is supplied to the word line WL0 in the program operation, the threshold voltage of the memory cell C0e1 does not rise because of the program inhibition voltage supplied to the bit line BLe1. As the threshold voltage of a memory cell is shifted as described above, different data may be stored in the memory cell.

Meanwhile, in a read operation, the page buffer group 150 precharges all the selected bit lines (e.g., BLe1 to BLek) of the even bit lines BLe1 to BLek and the odd bit lines BLo1 to BLok, but discharges all the unselected bit lines (e.g., BLo1 to BLok) thereof. Furthermore, when the read voltage Vread is supplied from the voltage supply circuit (130 and 140) to a selected word line (e.g., WL0), bit lines coupled to memory cells in which program data is stored maintain a precharge state, and bit lines coupled to memory cells in which erase data is stored are discharged. The page buffer group 150 senses a change in the voltages of the bit lines BLe1 to BLek and latches the data of the memory cells corresponding to the result of the sense.

The construction of the page buffer is described in detail later.

The column selector 160 selects the page buffers PB1 to PBk of the page buffer group 150 in response to the column address CADD. More particularly, the column selector 160 sequentially transfers data to be stored in memory cells to the page buffers PB1 to PBk in response to the column address CADD. Furthermore, the column selector 160 sequentially selects the page buffers PB1 to PBk in response to the column address CADD so that the data of memory cells latched in the page buffers PB1 to PBk may be externally outputted in a read operation.

In a program operation, the I/O circuit 170 transfers external data DATA to the column selector 160 under the control of the controller 120 so that the external data is inputted to the page buffer group 150 and is then stored in memory cells. When the external data DATA is transferred to the page buffers PB1 to PBk of the page buffer group 150, the page buffers PB1 to PBk store the external data in their internal latch circuits. Furthermore, in a read operation, the I/O circuit 170 externally outputs data DATA received from the page buffers PB1 to PBk of the page buffer group 150 via the column selector 160.

Meanwhile, the bit line coupling circuit 110DIV1 is disposed between the first and the second memory block groups 110G1 and 110G2. The bit line coupling circuit 110DIV1 selectively couples the bit lines BLe1 to BLek and BLo1 to BLok of the first and the second memory block groups 110G1 and 110G2 in response to the bit line coupling signals BLDIVe1 and BLDIVo1 in order to couple selected bit lines, coupled to a memory block group (e.g., 110G1) of the first and the second memory block groups 110G1 and 110G2, to the page buffer group 150. Particularly, when the first memory block group 110G1 is selected, the bit line coupling circuit 110DIV1 selectively couples the bit lines BLe1 to BLek or BLo1 to BLok of the first memory block group 110G1 to the bit lines BLe1 to BLek or BLo1 to BLok of the second memory block group 110G2, which is disposed between the first memory block group 110G1 and the page buffer group 150, in response to the bit line coupling signals BLDIVe1 and BLDIVo1.

If the number of memory block groups is two or more, for example, four groups 110G1 to 110G4 as in FIG. 3, bit line coupling circuits 110DIV1 to 110DIV3 are placed between memory block groups 110G1 to 110G4. Furthermore, if the memory block group 110G2 is selected, the bit line coupling circuits 110DIV1 to 110DIV3 selectively couple the bit lines BLe1 to BLek or BLo1 to BLok of the memory block group 110G2 to the bit lines BLe1 to BLek or BLo1 to BLok of the memory block groups 110G3 and 110G4, which is disposed between the memory block group 110G2 and the page buffer group 150, in response to the bit line coupling signals BLDIVe1, BLDIVo1, BLDIVe2, BLDIVo2, BLDIVe3, and BLDIVo3.

Particularly, the bit line coupling circuits 110DIV2 and 110DIV3 couple selected bit lines (e.g., BLe1 to BLek) of the even bit lines BLe1 to BLek and the odd bit lines BLo1 to BLok of the selected memory block group 110G2 to the bit lines BLe1 to BLek of unselected memory block groups 110G3 and 110G4 and disconnects the unselected bit lines BLo1 to BLok of the memory block groups 110G2 to 110G4 in order to couple the selected bit lines BLe1 to BLek to the page buffer group 150.

Referring back to FIG. 1, the bit line coupling circuit 110DIV1 includes even bit line coupling circuits Sbe1 to Sbek and odd bit line coupling circuits Sbo1 to Sbok. The even bit line coupling circuits Sbe1 to Sbek controls a connection between the even bit lines BLe1 to BLek of a selected memory block group (e.g., 110G1) and the even bit lines BLe1 to BLek of an unselected memory block group (e.g., 110G2) in response to the even bit line coupling signal BLDIVe1 of the bit line coupling signals BLDIVe1 and BLDIVo1. The odd bit line coupling circuits Sbo1 to Sbok controls a connection between the odd bit lines BLo1 to BLok of a selected memory block group (e.g., 110G1) and the odd bit lines BLo1 to BLok of an unselected memory block group (e.g., 110G2) in response to the odd bit line coupling signal BLDIVo1 of the bit line coupling signals BLDIVe1 and BLDIVo1.

If the even bit lines BLe1 to BLek of a selected memory block group (e.g., 110G1) are selected, the even bit line coupling circuits Sbe1 to Sbek couple the even bit lines BLe1 to BLek of the selected memory block group 110G1 to the even bit lines BLe1 to BLek of an unselected memory block group (e.g., 110G2), which is disposed between the selected memory block group 110G1 and the page buffer group 150, in response to the even bit line coupling signal BLDIVe1. Accordingly, the even bit lines BLe1 to BLek of the selected memory block group 110G1 are coupled to the page buffer group 150 through the even bit lines BLe1 to BLek of the unselected memory block 110G2. Here, the odd bit line coupling circuits Sbo1 to Sbok disconnects the odd bit lines BLo1 to BLok of the selected memory block group 110G1 from the odd bit lines BLo1 to BLok of the unselected memory block group 110G2 in response to the odd bit line coupling signal BLDIVo1.

If the odd bit lines BLo1 to BLok of a selected memory block group (e.g., 110G1) is selected, the odd bit line coupling circuits Sbo1 to Sbok couple the odd bit lines BLo1 to BLok of the selected memory block group 110G1 to the odd bit lines BLo1 to BLok of an unselected memory block group (e.g., 110G2), which is disposed between the selected memory block group 110G1 and the page buffer group 150, in response to the odd bit line coupling signal BLDIVo1. Accordingly, the odd bit lines BLo1 to BLok of the selected memory block group 110G1 are coupled to the page buffer group 150 through the odd bit lines BLo1 to BLok of the unselected memory block 110G2. Here, the even bit line coupling circuits Sbe1 to Sbek disconnect the even bit lines BLe1 to BLek of the selected memory block group 110G1 from the even bit lines BLe1 to BLek of the unselected memory block group 110G2 in response to the even bit line coupling signal BLDIVe1.

The bit line control circuits 110VP1 and 110VP2 are coupled to the respective memory block groups 110G1 and 110G2 in order to control the voltages of the unselected bit lines BLe1 to BLek or BLo1 to BLok of the respective memory block groups 110G1 and 110G2 in response to the bit line control signals UNSELBLe1, UNSELBLo1, UNSELBLe2, and UNSELBLo2.

Particularly, the bit line control circuit 110PV1 is configured to set unselected bit lines (e.g., BLo1 to BLok), among the even bit lines BLe1 to BLek and the odd bit lines BLo1 to BLok of the memory block group 110G1, in a precharge state, a discharge state, or a floating state. More specifically, the bit line control circuit 110PV1 is configured to set the unselected bit lines BLo1 to BLok in a precharge state or a floating state in a program operation and in a precharge state or a discharge state in a read operation, depending on whether the memory block group 110G1 has been selected or not.

For example, in a program operation, the bit line control circuit (e.g., 110PV1) of a selected memory block group (e.g., 110G1) may precharge the unselected bit lines (e.g., BLo1 to BLok) of the memory block group 110G1, and the bit line control circuit (e.g., 110PV2) of an unselected memory block group (e.g., 110G2) may set the unselected bit lines (e.g., BLo1 to BLok) of the memory block group 110G2 in a floating state. Furthermore, in a read operation, the bit line control circuit (e.g., 110PV1) of a selected memory block group (e.g., 110G1) may discharge the unselected bit lines (e.g., BLo1 to BLok) of the memory block group 110G1, and the bit line control circuit (e.g., 110PV2) of an unselected memory block group (e.g., 110G2) may precharge the unselected bit lines (e.g., BLo1 to BLok) of the memory block group 110G.

The unselected bit lines BLo1 to BLok are precharged by voltages VIRPWR1 and VIRPWR2 generated from the voltage generator 130 or discharged through the voltage generator 130.

Figure 4:
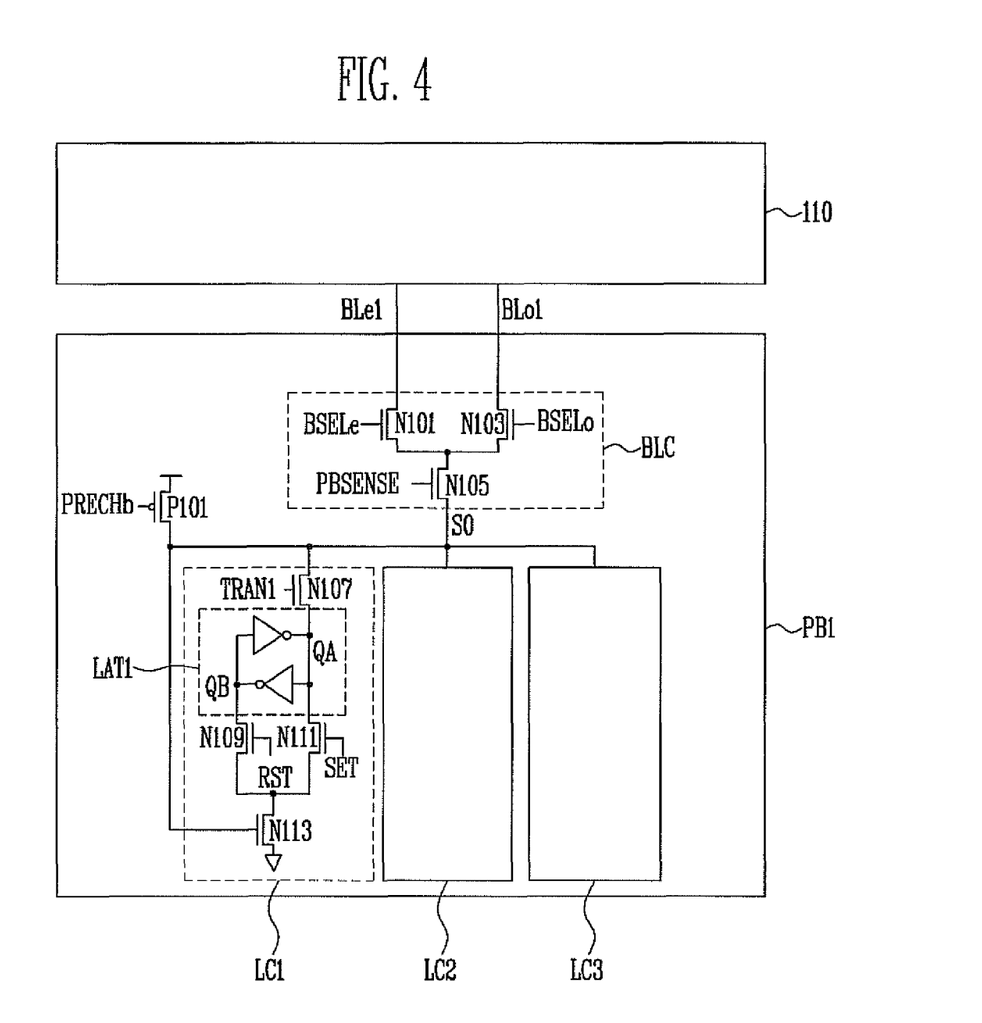
FIG. 4 is a circuit diagram of a page buffer shown in FIG. 1.

FIG. 4 is a circuit diagram of the page buffer shown in FIG. 1.

Referring to FIG. 4, the page buffer (e.g., PB1) is operated under the control of the controller 120. Signals PRECHb, TRAN1, RST, SET, PBSENSE, BLSELe, and BLSELo to be described hereinafter are included in the PB control signals PB_SIGNALS generated from the controller 120.

The page buffer PB1 includes a bit line coupler BLC, a precharge circuit P101, and a plurality of latch circuits (e.g., first to third latch circuits LC1 to LC3).

The switching elements N101 and N103 of the bit line coupler BLC selects one of the even bit line BLe1 and the odd bit line BLo1 in response to the bit line select signals BLSELe and BLSELo. The switching element N105 of the bit line coupler BLC couples a bit line, selected by the switching elements N101 and N103, to one of the first to third latch circuits LC1 to LC3 in response to the coupling signal PBSENSE. The first to third latch circuits LC1 to LC3 are coupled to the switching element N105 in parallel, and a node at which the switching element N105, i.e., the bit line coupler BLC, is coupled to the first to third latch circuits LC1 to LC3 is a sense node SO.

The precharge circuit P101 performs an operation of precharging the sense node SO in response to the precharge signal PRECHb.

The number of latch circuits LC1 to LC3 may be changed depending on a design purpose, and an example that the three latch circuits LC1 to LC3 are used is described below. Only one of the first to third latch circuits LC1 to LC3 is typically activated. For example, the first latch circuit LC1 may perform an operation of latching data received from the column selector 160 and transferring the data to the second latch circuit LC2 or an operation of latching data read from a memory cell in a read operation and outputting the read data to the column selector 160. The second latch circuit LC2 may perform an operation of supplying the program inhibition voltage or the program permission voltage to a corresponding bit line, depending on data received from the first latch circuit LC1 in a program operation. The second latch circuit LC2 may also perform an operation of latching data of a memory cell, coupled to the bit line, on the basis of the voltage of the bit line in a read operation and transferring the data to the first latch circuit LC1. In a program verification operation subsequent to a program operation, the third latch circuit LC3 may perform an operation of latching the result of comparing the threshold voltage of a memory cell with a target voltage and generating a resulting signal corresponding to the result of the comparison. In some embodiments, the second latch circuit LC2 may perform an operation of latching least significant bit (LSB) data, and the third latch circuit LC3 may perform an operation of latching most significant bit (MSB) data.

The first to third latch circuits LC1 to LC3 have the same construction, and thus only the first latch circuit LC1 is described below as an example.

The first latch circuit LC1 includes a latch LAT1 configured to latch data, a switching element N107 configured to couple the non-inverting terminal QA of the latch LAT1 to the sense node SO in response to the transfer signal TRAN1, switching elements N111 and N109 coupled to the non-inverting terminal QA and the inverting terminal QB of the latch LAT1, respectively, and operated in response to a set signal SET and a reset signal RST, respectively, and a switching element N113 coupled between the switching elements N109 and N111 and a ground terminal and operated on the basis of voltage of the sense node SO. For reference, the column selector 160 couples the sense node SO of a selected page buffer (e.g., PB1) to the non-inverting terminal QA and the inverting terminal QB of the latch LAT1 in response to the column address CADD.

Meanwhile, signals with different waveforms are inputted to the latch circuits LC2 and LC3. Thus, only one of the first to third latch circuits LC1 to LC3 is activated or the first to third latch circuits LC1 to LC3 may perform different functions although they have the same construction.

An operation of the semiconductor memory device is described below.

Figure 5A:
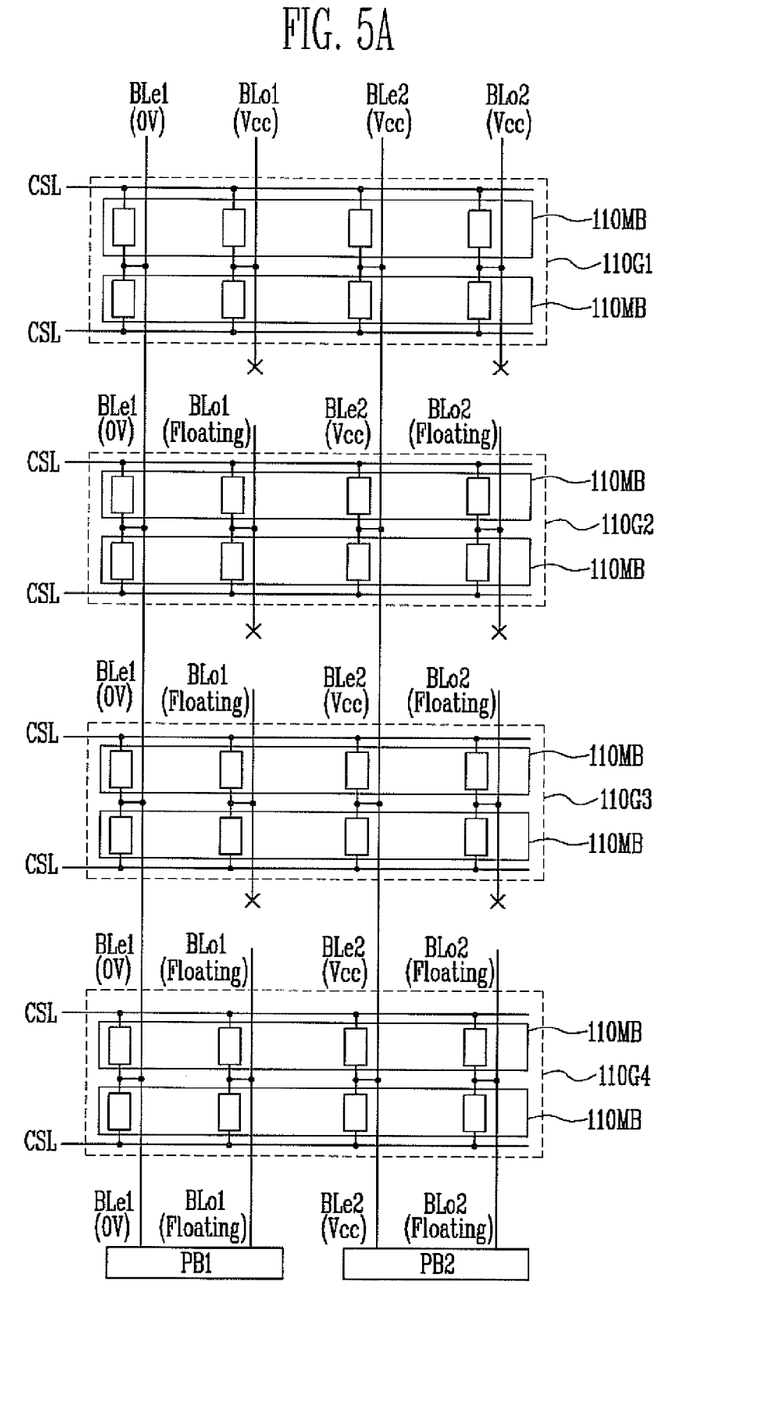
FIGS. 5A and 5B are block diagrams illustrating an operation of the semiconductor memory device according to an exemplary embodiment of this disclosure.
Figure 5B:
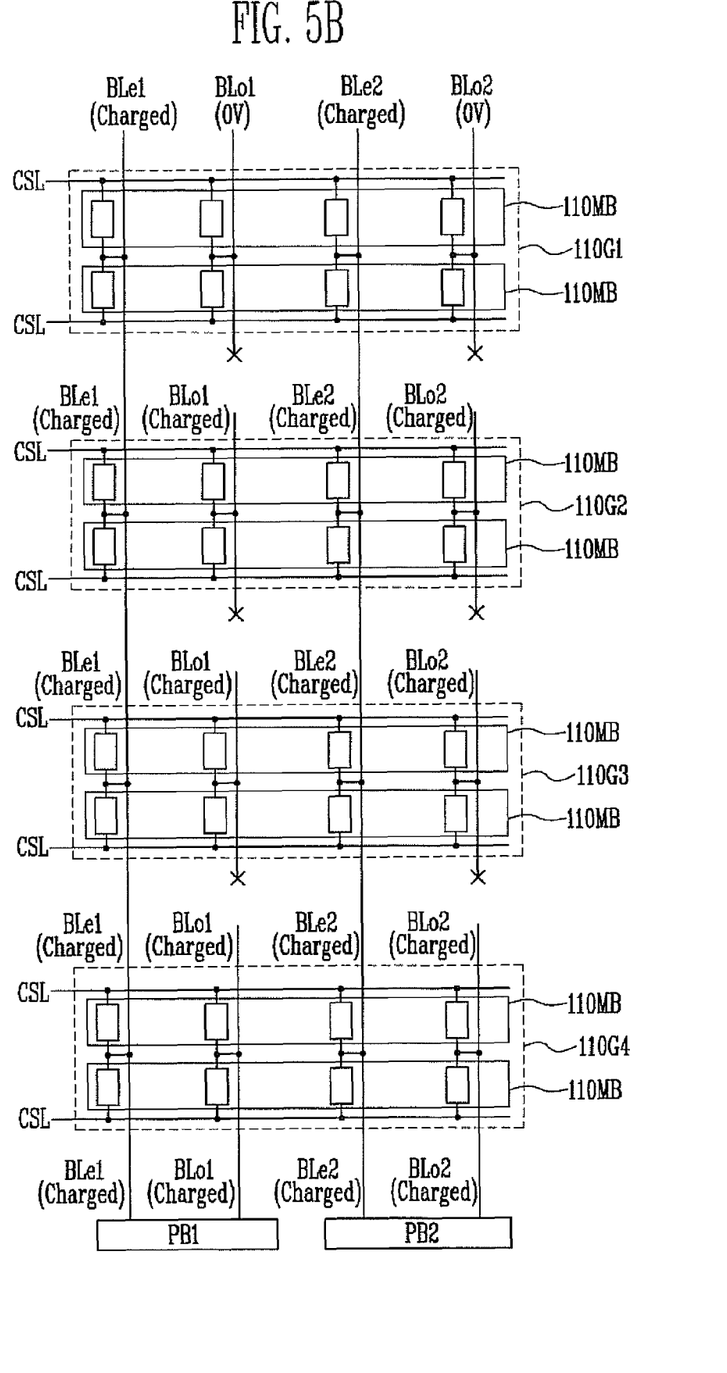

FIGS. 5A and 5B are block diagrams illustrating an operation of the semiconductor memory device according to an exemplary embodiment of this disclosure.

Referring to FIGS. 1, 3, and 5A, in a program operation, if the even bit lines BLe1 to BLek are selected, the bit line coupling circuits 110DIV1 to 110DIV3 couple the even bit lines BLe1 to BLek of the memory block groups 110G1 to 110G4 in response to the bit line coupling signals BLDIVe1 to BLDIVe3. For example, if the first memory block group 110G1 is selected, the bit line coupling circuits 110DIV1 to 110DIV3 couple all the even bit lines BLe1 to BLek of all the memory block groups 110G1 to 110G4 in order to couple the even bit lines BLe1 to BLek of the first memory block group 110G1 to the page buffer group 150. Here, whenever the even bit lines BLe1 to BLek are selected, the bit line coupling circuits 110DIV1 to 110DIV3 may couple all the even bit lines BLe1 to BLek of all the memory block groups 110G1 to 110G4, irrespective of which memory block group is selected. On the other hand, if the third memory block group 110G3 is selected, for example, the bit line coupling circuit 110DIV3 may couple only the even bit lines BLe1 to BLek of the third and the fourth memory block groups 110G3 and 110G4 in order to couple the even bit lines BLe1 to BLek of the third memory block group 110G3 to the page buffer group 150. In this case, the total length of the even bit lines BLe1 to BLek coupled to the page buffer group 150 may be shortened depending on the position of a selected memory block group. Consequently, when the even bit lines BLe1 to BLek are precharged or a program inhibition voltage (e.g., a power supply voltage) is supplied to the even bit lines BLe1 to BLek, the speed of precharging or supplying the even bit lines BLe1 to BLek may be increased.

The page buffer group 150 supplies the program inhibition voltage or a program permission voltage (e.g., a ground voltage) to the even bit lines BLe1 to BLek depending on data to be stored in memory cells. For example, the program permission voltage may be supplied to an even bit line coupled to a memory cell to store program data (e.g., data '0'), and the program inhibition voltage may be supplied to an even bit line coupled to a memory cell to store erase data (e.g., data '1').

Meanwhile, the bit line coupling circuits 110DIV1 to 110DIV3 do not couple the unselected bit lines (i.e., the odd bit lines BLo1 to BLok) of the memory block groups 110G1 to 110G4. Furthermore, the bit line control circuit 110PV1 precharges the odd bit lines BLo1 to BLok of the selected memory block group 110G1 by using the voltage VIRPWR1 outputted from the voltage generator 130. In other words, when a program operation of storing data in even memory cells is performed, the voltage VIRPWR1 is supplied to the odd bit lines BLo1 to BLok as a program inhibition voltage in order to prevent odd memory cells, placed between the even memory cells and supplied with a program voltage, from being programmed. Since all the odd bit lines BLo1 to BLok of all the memory block groups 110G1 to 110G4 are not coupled as described above, the odd bit lines BLo1 to BLok of the selected memory block group 110G1 may be rapidly precharged, thereby increasing an operating speed.

Furthermore, the bit line control circuits 110PV2 to 110PV4 set the odd bit lines BLo1 to BLok of the unselected memory block groups 110G2 to 110G4 in a floating state. When the odd bit lines BLo1 to BLok of the unselected memory block groups 110G2 to 110G4 are set in a floating state, the even bit lines BLe1 to BLek may be rapidly precharged and the operating speed may be increased because parasitic capacitance or interference between the even bit lines BLe1 to BLek and the odd bit lines BLo1 to BLok is reduced.

Next, the program voltage Vpgm is supplied to a selected word line of a memory block, selected from among the memory blocks 110MB of the selected memory block group 110G1, the program pass voltage Vpass1 is supplied to the unselected word lines of the selected memory block 110MB, the select voltage Vdsl having the same level as the power supply voltage and the select voltage Vssl having the same level as the ground voltage are supplied to the select lines DSL and SSL, respectively, and the voltage Vsl having the same level as the power supply voltage is supplied to the common source line CSL. As a result, the threshold voltage of an even memory cell coupled to an even bit line to which the ground voltage is supplied, among even memory cells coupled to the selected word line, rises.

The program operation for storing data is performed as described above.

Referring to FIG. 5B, in a read operation, if the first memory block group 110G1 is selected and the even bit lines BLe1 to BLek thereof are selected, the bit line coupling circuits 110DIV1 to 110DIV3 couple all the even bit lines BLe1 to BLek of all the memory block groups 110G1 to 110G4 in response to the bit line coupling signals BLDIVe1 to BLDIVe3 in order to couple the even bit lines BLe1 to BLek of the memory block group 110G1 to the page buffer group 150. The even bit lines BLe1 to BLek may be coupled as described above with reference to FIG. 5A.

The page buffer group 150 precharges the even bit lines BLe1 to BLek.

Meanwhile, the bit line coupling circuits 110DIV1 to 110DIV3 do not couple the unselected bit lines (i.e., the odd bit lines BLo1 to BLok) of the memory block groups 110G1 to 110G4.

The bit line control circuit 110PV1 discharges the odd bit lines BLo1 to BLok of the selected memory block group 110G1 by using the voltage VIRPWR1 having the same level as the ground voltage. Furthermore, the bit line control circuits 110PV2 to 110PV4 precharge the odd bit lines BLo1 to BLok of the unselected memory block groups 110G2 to 110G4 by using the voltages VIRPWR2 to VIRPWR4 having the same level as the power supply voltage. The odd bit lines BLo1 to BLok of the unselected memory block groups 110G2 to 110G4 are precharged along with the even bit lines BLe1 to BLek as described above. Accordingly, the even bit lines BLe1 to BLek may be rapidly precharged and the operating speed may be increased because parasitic capacitance or interference between the even bit lines BLe1 to BLek and the odd bit lines BLo1 to BLok is reduced.

Next, the read voltage Vread is supplied to a selected word line of a memory block, selected from among the memory blocks 110MB of the selected memory block group 110G1, the read pass voltage Vpass2 is supplied to the unselected word lines of the selected memory block 110MB, the select voltages Vdsl and Vssl having the same level as the power supply voltage are supplied to the respective select lines DSL and SSL, and the voltage Vsl having the same level as the ground voltage is supplied to the common source line CSL. As a result, an even bit line coupled to a memory cell having a threshold voltage lower than the read voltage Vread is discharged, and an even bit line coupled to a memory cell having a threshold voltages higher than the read voltage Vread maintains a precharge state.

The page buffers PB1 to PBk of the page buffer group 150 sense the voltages of the even bit lines BLe1 to BLek and latch values corresponding to the result of the sense. The values latched in the page buffers PB1 to PBk corresponds data stored in memory cells coupled to the even bit lines BLe1 to BLek. Next, the data latched in the page buffer group 150 is externally outputted through the column selector 160 and the I/O circuit 170.

The read operation of storing data is performed as described above.

Figure 6:
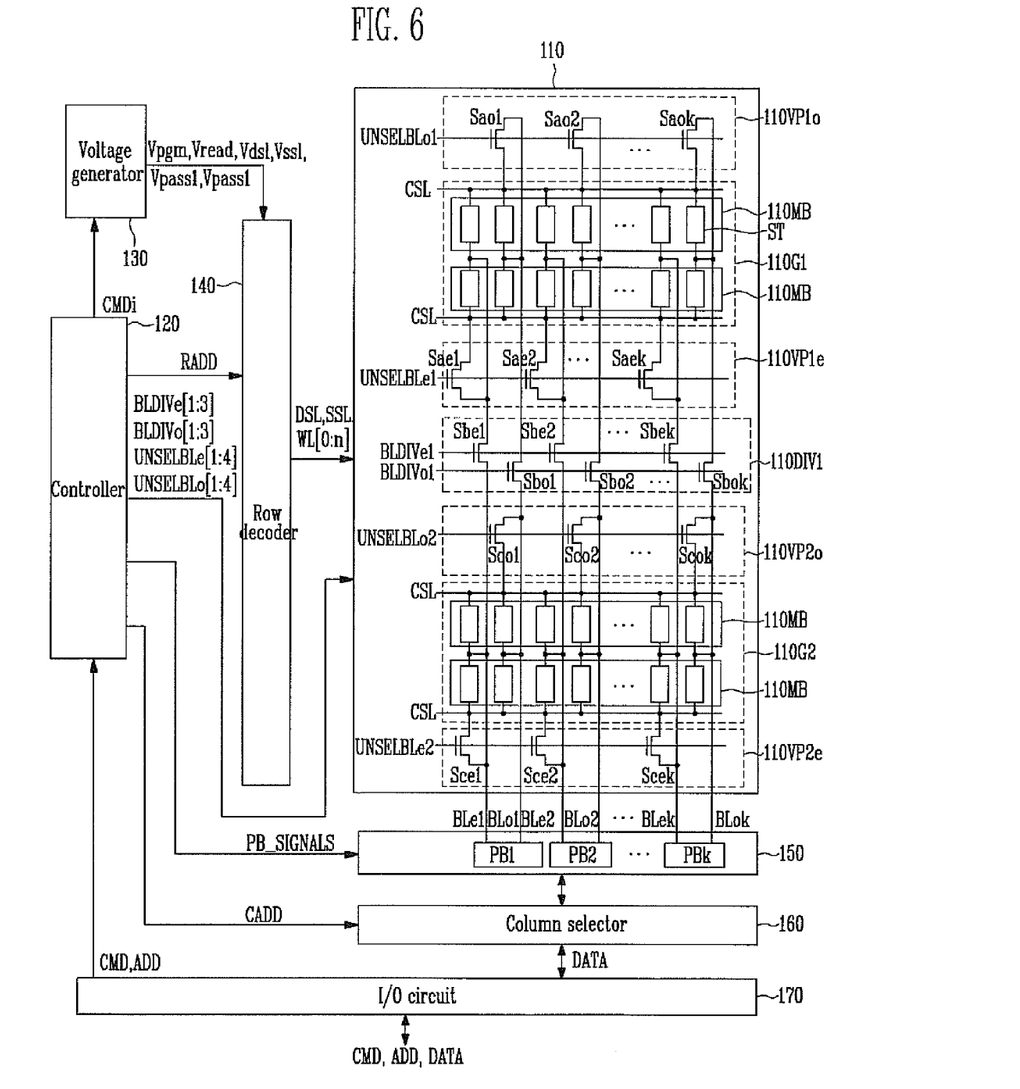
FIGS. 6 and 7 are block diagrams of a semiconductor memory device according to yet another exemplary embodiment of this disclosure.
Figure 7:
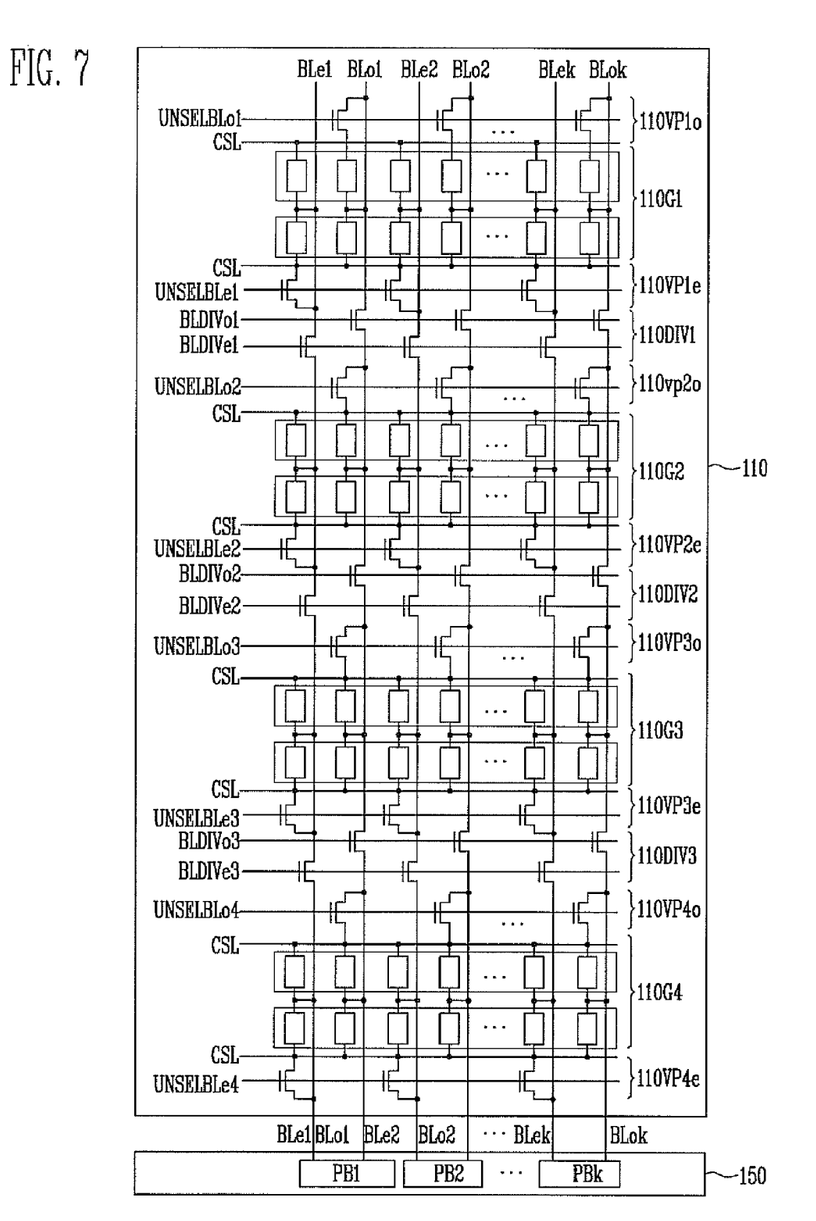

FIGS. 6 and 7 are block diagrams of a semiconductor memory device according to yet another exemplary embodiment of this disclosure.

Referring to FIG. 6, the semiconductor memory device includes a memory cell array 110, a page buffer group 150, a bit line coupling circuit 110DIV1, and bit line control circuits 110VP1e, 110VP1o, 110VP2e, and 110VP2o. The semiconductor memory device further includes a voltage supply circuit (130 and 140) for supplying operating voltages to memory blocks 110MB. The semiconductor memory device may further include a column selector 160 for controlling the transfer of data between the page buffer group 150 and an I/O circuit 170. In a program operation or a read operation, the circuits 110DIV1, 110VP1e, 110VP1o, 110VP2e, 110VP2o, 130, 140, 150, and 160 are controlled by a controller 120.

The semiconductor memory device has almost the same elements as the semiconductor memory device of FIG. 1 except bit line control circuits 110VP1e, 110VP1o, 110VP2e, and 110VP2o. Accordingly, the bit line control circuits 110VP1e, 110VP1o, 110VP2e, and 110VP2o, the coupling relationship therebetween, and the operations thereof are chiefly described, for the sake of simplicity.

The bit line control circuits 110VP1e, 110VP1o, 110VP2e, and 110VP2o are configured to couple unselected bit lines (e.g., BLo1 to BLok), among the bit lines BLe1 to BLek and BLo1 to BLok of a selected memory block group (e.g., 110G1), to the common source line CSL and configured to differently control unselected bit lines (e.g., BLo1 to BLok), among the bit lines BLe1 to BLek and BLo1 to BLok of an unselected memory block (e.g., 110G2), depending on a program operation and a read operation.

More specifically, the bit line control circuits 110VP1e and 110VP1o, and 110VP2e and 110VP2o are provided in the respective memory block groups 110G1 and 110G2. The memory block group 110G1 includes the even bit line control circuit 110VP1e and the odd bit line control circuit 110VP1o. The even bit line control circuit 110VP1e controls a connection between the even bit lines BLe1 to BLek and the common source line CSL in response to an even bit line control signal UNSELBLe1. The odd bit line control circuit 110VP1o controls a connection between the odd bit lines BLo1 to BLok and the common source line CSL in response to an odd bit line control signal UNSELBLo1.

Furthermore, in a program operation, the bit line control circuits 110VP1e and 110VP1o of the selected memory block group 110G1 precharge the unselected bit lines BLo1 to BLok of the selected memory block group 110G1 by using voltage supplied to the common source line CSL from the voltage generator 130. The bit line control circuits 110VP2e and 110VP2o of the unselected memory block group 110G2 sets the unselected bit lines BLo1 to BLok of the unselected memory block group 110G2 in a floating state.

In a read operation, the bit line control circuits 110VP1e and 110VP1o of the selected memory block group 110G1 discharge the unselected bit lines BLo1 to BLok of the selected memory block group 110G1 through the common source line CSL. The bit line control circuits 110VP2e and 110VP2o of the unselected memory block group 110G2 precharge the unselected bit lines BLo1 to BLok of the unselected memory block group 110G2.

The voltage supply circuit (130 and 140) supplies a power supply voltage to the common source line CSL in the program operation and supplies a ground voltage to the common source line CSL in the read operation.

If the number of memory block groups is two or more, for example, four groups 110G1 to 110G4 as in FIG. 7, bit line coupling circuits 110DIV1 to 110DIV3 are placed between memory block groups 110G1 to 110G4. Furthermore, if the memory block group 110G2 is selected, the bit line coupling circuits 110DIV1 to 110DIV3 selectively couple the selected bit lines BLe1 to BLek or BLo1 to BLok of the selected memory block group 110G2 to the bit lines BLe1 to BLek or BLo1 to BLok of the unselected memory block groups 110G3 and 110G4, which is disposed between the selected memory block group 110G2 and the page buffer group 150, in response to bit line coupling signals BLDIVe1, BLDIVo1, BLDIVe2, BLDIVo2, BLDIVe3, and BLDIVo3.

Particularly, the bit line coupling circuits 110DIV2 and 110DIV3 are configured to couple bit lines (e.g., BLe1 to BLek), selected from among the even bit lines BLe1 to BLek and the odd bit lines BLo1 to BLok of the selected memory block group 110G2, to the bit lines BLe1 to BLek of the unselected memory block groups 110G3 and 110G4 and configured to disconnect the unselected bit lines BLo1 to BLok of the memory block groups 110G2 to 110G4 in order to couple the selected bit lines BLe1 to BLek to the page buffer group 150.

As described above, the bit line control circuits 110VP1e to 110PV4e and 110VP1o to 110PV4o selectively couple the bit lines BLe1 to BLek and BLo1 to BLok of the memory block groups 110G1 to 110G4 to the common source line CSL. Accordingly, the semiconductor memory device of FIG. 6 or 7 may perform a program operation as described with reference to FIG. 5A or perform a read operation as described with reference to FIG. 5B, and thus the same effect may be achieved.

In accordance with the present disclosure, parasitic capacitance between bit lines may be reduced and thus the operating speed may be increased.

What is claimed is:

1. A semiconductor memory device, comprising:
a memory cell array comprising two or more memory block groups each coupled to bit lines;
a page buffer group coupled to first bit lines of a first memory block group and configured to control voltages of the first bit lines of the first memory block group depending on data to be stored in memory cells in a program operation and configured to sense the voltage of the first bit lines in a read operation;
at least one bit line coupling circuit configured to couple first bit lines of a $n^{th}$ memory block group, selected from among the memory block groups, to the page buffer group by selectively coupling first bit lines of the first to $n^{th}$ memory block groups in response to bit line coupling signals; and
bit line control circuits configured to control second bit lines of the memory block groups in response to bit line control signals.

2. The semiconductor memory device of claim 1, wherein in the program operation, the bit line control circuit of the $n^{th}$ memory block group precharges the second bit lines of the $n^{th}$ memory block group, and the bit line control circuits of the remaining memory block groups set the second bit lines of the remaining memory block groups in a floating state.

3. The semiconductor memory device of claim 1, wherein in the read operation, the bit line control circuit of the $n^{th}$ memory block group discharges the second bit lines of the $n^{th}$ memory block group, and the bit line control circuits of the remaining memory block groups precharge the second bit lines of the remaining memory block groups.

4. The semiconductor memory device of claim 1, further comprising a voltage supply circuit configured to supply voltages for the program operation or the read operation to a selected memory block of the $n^{th}$ memory block group.

5. The semiconductor memory device of claim 1, wherein the bit line coupling circuits are configured to disconnect the second bit lines of the memory block groups when the first bit lines of the first to $n^{th}$ memory block groups are connected to each other.

6. The semiconductor memory device of claim 1, wherein the bit line coupling circuit comprises:
even bit line coupling circuits configured to control a connection between even bit lines of the memory block groups in response to even bit line coupling signals of the bit line coupling signals; and
odd bit line coupling circuits configured to control a connection between odd bit lines of the memory block groups in response to odd bit line coupling signals of the bit line coupling signals.

7. The semiconductor memory device of claim 6, wherein, when the even bit lines of the $n^{th}$ memory block group are selected as the first bit lines thereof, the even bit line coupling circuits couple the even bit lines of the $n^{th}$ memory block group to the even bit lines of memory block groups disposed between the $n^{th}$ memory block group and the page buffer group.

8. The semiconductor memory device of claim 7, wherein the odd bit line coupling circuits disconnect the odd bit lines of the memory block groups from each other.

9. The semiconductor memory device of claim 6, wherein, when the odd bit lines of the $n^{th}$ memory block group are selected as the first bit lines thereof, the odd bit line coupling circuits couple the odd bit lines of the $n^{th}$ memory block group to the odd bit lines of memory block groups disposed between the $n^{th}$ memory block group and the page buffer group.

10. The semiconductor memory device of claim 9, wherein the even bit line coupling circuits disconnect the even bit lines of the memory block groups from each other.

11. The semiconductor memory device of claim 1, wherein the bit line control circuits are configured to set the second bit lines of the memory block groups in one of a precharge state, a discharge state, and a floating state.

12. The semiconductor memory device of claim 1, wherein the bit line control circuits are configured to set the second bit lines of the memory block groups in a precharge state or a floating state in the program operation and in the precharge state or a discharge state in the read operation, depending on whether the memory block groups are selected as the $n^{th}$ memory block group.

13. The semiconductor memory device of claim 1, further comprising a controller configured to generate the bit line control signals and the bit line coupling signals in response to an address signal.

14. The semiconductor memory device of claim 1, wherein:
the page buffer group comprises page buffers corresponding to respective pairs of the first and second bit lines of the first memory block group, and
each of the page buffers comprises a bit line select circuit configured to select one bit line of the pair in response to a bit line select signal.

15. A semiconductor memory device, comprising:
two or more memory block groups each comprising memory strings coupled between a common source line and respective bit lines;
a page buffer group configured to control voltages of first bit lines of a memory block group, selected from among the memory block groups, depending on data to be stored in memory cells coupled to the first bit lines in a program operation and configured to sense the voltage of the first bit lines in a read operation;
at least one bit line coupling circuit configured to couple the first bit lines of the selected memory block group to the page buffer group in response to bit line coupling signals; and
two or more bit line control circuits configured to couple second bit lines of the selected memory block group to the common source line thereof and control voltages of second bit lines of memory blocks remaining among the memory block groups depending on the program operation and the read operation in response to the bit line control signals.

16. The semiconductor memory device of claim 15, wherein the bit line coupling circuit is configured to couple the first bit lines of the selected memory block group to the page buffer group by coupling first bit lines of memory block groups between the selected memory block group and the page buffer group.

17. The semiconductor memory device of claim 15, wherein the bit line coupling circuit is configured to couple the first bit lines of the selected memory block group to the page buffer group by coupling first bit lines of the memory block groups and disconnecting the second bit lines of the memory block groups.

18. The semiconductor memory device of claim 15, wherein the bit line coupling circuit comprises:
even bit line coupling circuits configured to control a connection between even bit lines the memory block groups in response to even bit line coupling signals of the bit line coupling signals; and
odd bit line coupling circuits configured to control a connection between odd bit lines of the memory block groups in response to odd bit line coupling signals of the bit line coupling signals.

19. The semiconductor memory device of claim 18, wherein, when the even bit lines of the selected memory block group are selected as the first bit lines thereof, the even bit line coupling circuits couple the even bit lines of the selected memory block group to the even bit lines of memory block groups disposed between the selected memory block group and the page buffer group.

20. The semiconductor memory device of claim 19, wherein the odd bit line coupling circuits disconnect the odd bit lines of the memory block groups from each other.

21. The semiconductor memory device of claim 18, wherein, when the odd bit lines of the selected memory block group are selected as the first bit lines thereof, the odd bit line coupling circuit couple the odd bit lines of the selected memory block group to the odd bit lines of memory block groups disposed between the selected memory block group and the page buffer group.

22. The semiconductor memory device of claim 21, wherein the even bit line coupling circuits disconnect the even bit lines of the memory block groups from each other.

23. The semiconductor memory device of claim 15, wherein the bit line control circuits are configured to set the second bit lines bit lines of the memory block groups in one of a precharge state, a discharge state, and a floating state.

24. The semiconductor memory device of claim 15, wherein the bit line control circuits are configured to set the second bit lines of the memory block groups in a precharge state or a floating state in the program operation and in the precharge state or a discharge state in the read operation, depending on whether the memory block groups are selected as the selected memory block group.

25. The semiconductor memory device of claim 15, wherein in the program operation, the bit line control circuit of the selected memory block group is configured to precharge the second bit lines of the selected memory block group by using voltage supplied to the common source line thereof, and the bit line control circuits of the remaining memory block groups are configured to set the voltages of the second bit lines of the remaining memory block groups in a floating state.

26. The semiconductor memory device of claim 15, wherein in the read operation, the bit line control circuit of the selected memory block group is configured to discharge the second bit lines of the selected memory block group through the common source line thereof, and the bit line control circuits of the remaining memory block groups are configured to precharge the voltages of the second bit lines of the remaining memory block groups.

27. The semiconductor memory device of claim 15, further comprising a voltage supply circuit configured to supply the common source lines of the memory block groups with a power supply voltage in the program operation and a ground voltage in the read operation.

28. The semiconductor memory device of claim 27, wherein the voltage supply circuit is configured to supply a program voltage and a program pass voltage for the program operation to a memory block, selected from among memory blocks of the selected memory block group, and a read voltage and a read pass voltage for the read operation to the selected memory block.

29. The semiconductor memory device of claim 15, further comprising a controller configured to generate the bit line control signals and the bit line coupling signals in response to an address signal.

30. The semiconductor memory device of claim 15, wherein:
the page buffer group comprises page buffers corresponding to respective pairs of the first and second bit lines of the selected memory block group, and each of the page buffers comprises a bit line select circuit configured to select one bit line of the pair in response to a bit line select signal.

* * * * *